United States Patent
Eng, Jr.

(10) Patent No.: US 7,990,162 B2
(45) Date of Patent: Aug. 2, 2011

(54) SYSTEMS AND METHODS FOR AN OPEN CIRCUIT CURRENT LIMITER

(75) Inventor: Benjamin Eng, Jr., Everett, WA (US)

(73) Assignee: Fluke Corporation, Everett, WA (US)

( * ) Notice: Subject to any disclaimer, the term of this patent is extended or adjusted under 35 U.S.C. 154(b) by 325 days.

(21) Appl. No.: 11/838,870

(22) Filed: Aug. 14, 2007

(65) Prior Publication Data
US 2009/0045825 A1    Feb. 19, 2009

(51) Int. Cl.
*G01R 27/08*    (2006.01)
*G01R 1/00*    (2006.01)

(52) U.S. Cl. .......... 324/713; 324/114
(58) Field of Classification Search .......... 324/713, 324/114
See application file for complete search history.

(56) References Cited

U.S. PATENT DOCUMENTS

| | | | | |
|---|---|---|---|---|
| 3,434,050 A * | 3/1969 | Van Schoiack | ............... | 324/606 |
| 5,179,335 A * | 1/1993 | Nor | ............... | 320/159 |
| 5,418,450 A * | 5/1995 | Bacon | ............... | 324/110 |
| 5,477,125 A * | 12/1995 | Ettel et al. | ............... | 320/156 |
| 5,557,197 A * | 9/1996 | Schulze et al. | ............... | 324/115 |
| 5,705,936 A * | 1/1998 | Gibson et al. | ............... | 324/767 |
| 5,870,042 A * | 2/1999 | Noda | ............... | 341/120 |
| 6,043,640 A * | 3/2000 | Lauby et al. | ............... | 324/127 |
| 6,465,908 B1 * | 10/2002 | Karuppana et al. | ............... | 307/31 |
| 7,511,584 B2 * | 3/2009 | Hung | ............... | 331/57 |
| 2004/0021462 A1 * | 2/2004 | Saito | ............... | 324/251 |
| 2007/0241763 A1 * | 10/2007 | Panhofer | ............... | 324/664 |

* cited by examiner

*Primary Examiner* — Timothy J Dole
(74) *Attorney, Agent, or Firm* — Perkins Coie LLP

(57) ABSTRACT

A resistance measuring circuit includes a current generating component, a current control component, and a voltage measurement component. The magnitude of a target resistance can be measured by connecting the target resistance between first and second measurement terminals of the resistance measuring circuit, applying a current generated by the current generating component to the target resistance, and determining the voltage across the target resistance. When no target resistance is connected between the first and second measurement terminals, the current control component controls the current generating component to reduce current consumption of the resistance measuring circuit.

16 Claims, 6 Drawing Sheets

SYSTEMS AND METHODS FOR AN OPEN CIRCUIT CURRENT LIMITER

BACKGROUND

Electrical multimeters can typically perform measurement of a wide range of physical and electrical parameters. Some may have a low-ohms measurement function for measuring small electrical resistances, e.g., less than 100 ohms. To implement the low-ohms measurement function, the multimeter will typically include a current source that can be coupled by a pair of electrical leads to an unknown resistance to be measured.

During use in the field, a user may frequently leave a multimeter powered on in a low-ohms measurement mode while the multimeter is not taking a live measurement. When a multimeter is powered on in the low-ohms measurement mode but no resistor is at the leads, the electrical leads will form an open-circuit. In the open-circuit configuration, a typical multimeter device may continue to draw a substantial amount of current from its battery power source. Such current consumption while at idle may significantly decrease the battery life of a portable multimeter device.

The headings provided herein are for convenience only and do not necessarily affect the scope or meaning of the claimed invention.

DETAILED DESCRIPTION

Circuits and methods for measuring electrical resistance are disclosed below. These circuits and methods are well adapted for implementation within electrical multimeters, but could also be implemented in other devices or systems, including stand-alone resistance measuring systems. The circuits and methods described below could also be adapted to function in other systems or devices in which an open-circuit configuration is maintained for some period of time.

Figure 1:
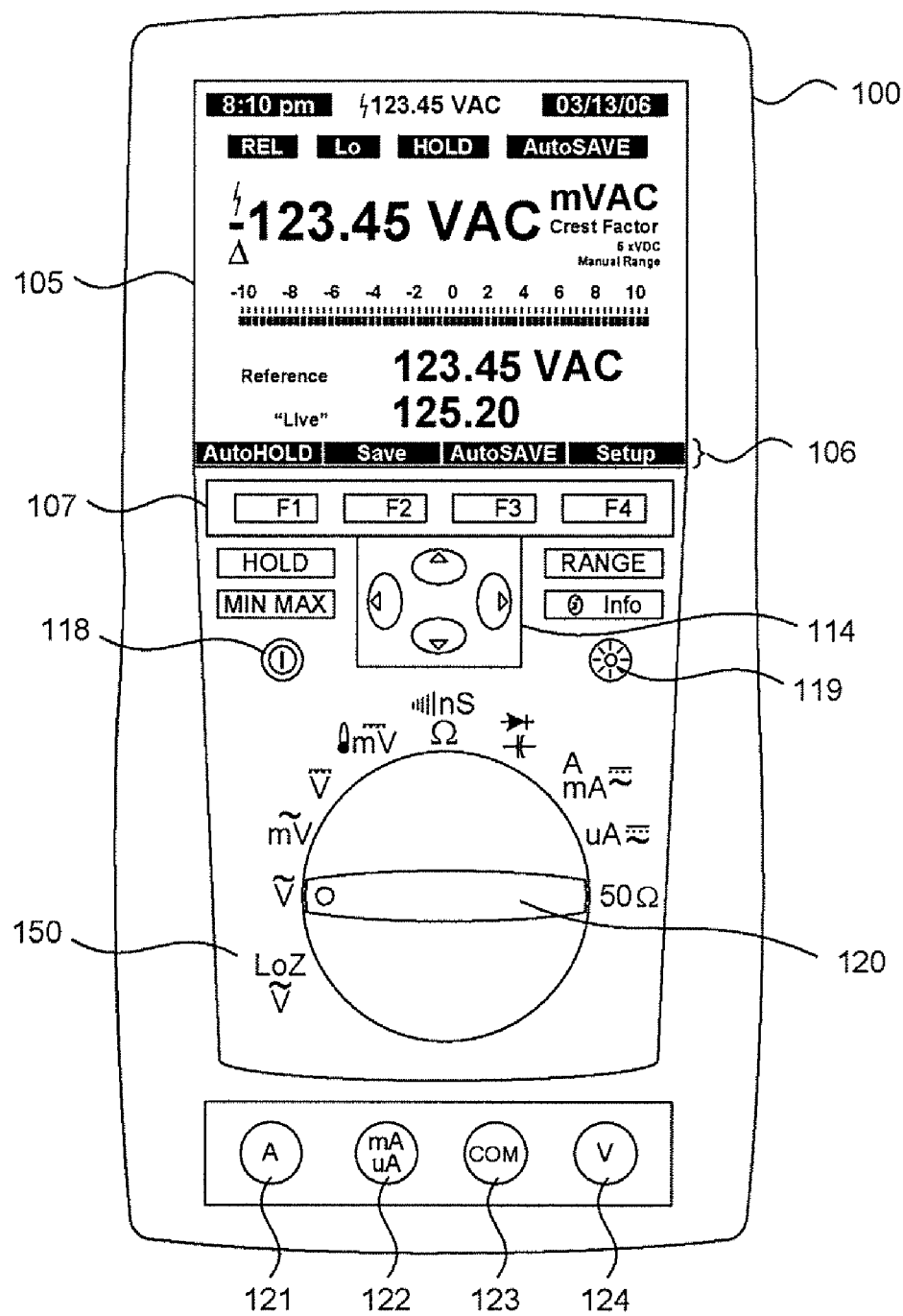
FIG. 1 is a schematic diagram illustrating a front face of an example digital multimeter.

An example of a multimeter is illustrated in FIG. 1. Referring to FIG. 1, a multimeter 100 comprises a display 105 and a rotary switch 120. A user can interact with the multimeter using any of several interfaces. For input, buttons and/or rotary switch 120 can be used to request various measurements and/or processed versions of those measurements. A secondary button can be pressed to select any rotary switch alternate function. Other buttons can be used to choose modifiers for the selected function.

Analog connections on input jacks 121-124 can be used to provide measurement inputs to multimeter 100. In some embodiments, four jacks can be included along the bottom of multimeter 100 where the user can connect input probes for measuring signals of interest. Output is presented to the user via display 105, which is shown as a liquid crystal (LCD) display in FIG. 1. In other embodiments, the LCD display could be substituted by an indicator light, and/or an audible beeper. In addition, a remote interface could be used to control and query multimeter 100.

An area between display 105 and rotary switch 120 contains various soft keys and buttons. A lower portion of display 105 contains labels 106 corresponding to soft keys 107 (labeled [F1] through [F4]) below display 105. Pressing one of the soft keys invokes a function indicated by the corresponding label on the display. Multimeter 100 further comprises navigation buttons 114, an on/off switch 118, and a backlight control button 119. In some embodiments, the meter can use AA alkaline or rechargeable batteries and can use any of several techniques to conserve battery power.

In embodiments supporting a low-ohms measurement function, rotary switch 120 is rotated to a position 150 labeled "LoZ." At position 150, multimeter 100 operates in the low-ohms measurement mode and can employ various techniques to measure unknown resistances connected between electrical leads corresponding to a pair of input jacks 121-124.

In a broad sense, the low-ohms measurement function of a multimeter or other device can be implemented by a resistance measurement circuit comprising an active portion and a pair of measurement terminals corresponding to a pair of electrical leads or another type of connection component. As an example, FIG. 2 shows a block diagram conceptually illustrating various components of a resistance measurement circuit in accordance with selected embodiments of the invention.

Figure 2:
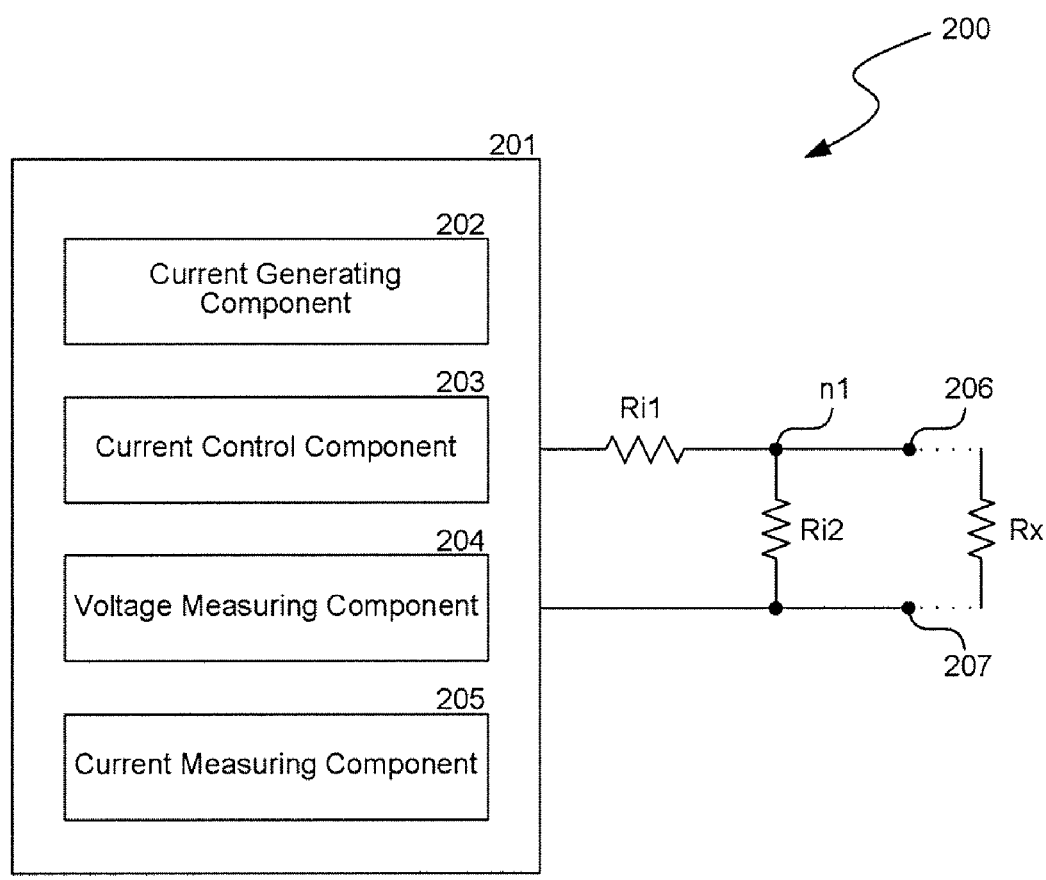
FIG. 2 is a conceptual block diagram illustrating various components of an example circuit for measuring electrical resistance.

Referring to FIG. 2, a resistance measurement circuit 200 comprises an active portion 201 and respective first and second measurement terminals 206 and 207. Resistance measurement circuit 200 has relatively large internal resistances Ri1 and Ri2, with resistance Ri2 being connected between the first and second measurement terminals.

To perform a resistance measurement function using resistance measurement circuit 200, an unknown resistance Rx is connected between first and second measurement terminals 206 and 207 so that its resistance can be measured. In general, a resistance to be measured can be referred to as a "target resistance". However, as used herein, such resistances may also be referred to as "unknown resistances". The target resistance or unknown resistance described herein can be any form of or type of electrical component, part or device which has a resistivity. Where a connection is made between first and second measurement terminals 206 and 207, resistance measurement circuit 200 will be considered to be in a closed-circuit configuration. Where no connection is made between first and second measurement terminals 206 and 207, resistance measurement circuit 200 will be considered to be in an open-circuit configuration.

When resistance measurement circuit 200 is in the closed-circuit configuration, active portion 201 is controlled to generate a first current having a first magnitude through a circuit node labeled n1. Because unknown resistance Rx is relatively small compared with internal resistance Ri2, most of the current passing through node n1 flows through unknown resistance Rx. On the other hand, where resistance measurement circuit 200 is in the open-circuit configuration, active portion 201 is controlled to generate a second current having a second magnitude through node n1. In order to limit power consumption, active portion 201 controls the magnitude of the second current such that it is smaller than the magnitude of the first current used in the closed circuit configuration.

In general, resistance measurement circuit 200 is designed so that the magnitude of the first current is sufficiently large to achieve strong signals for measuring the magnitude of unknown resistance Rx. For instance, a relatively large current may be required to achieve a voltage drop across resistance Rx that can be readily detected.

Active portion 201 comprises a current generating component 202, a current control component 203, a voltage measuring component 204, and a current measuring component 205.

In general, current generating component 202 generates a current for measuring the resistance of unknown resistance Rx. The concept of current generation as used in this description should be viewed in a broad sense as encompassing a variety of current generation techniques and should not be construed as limited to specific types of current sources generating a static output current. Moreover, a current generating component generating a particular current may be embodied by a collection of multiple discrete components within a circuit. For example, a voltage source coupled to a set of resistances may generate a certain current when coupled to a particular target resistance.

In some embodiments, current generating component 202 can be designed to generate a known stable current through unknown resistance Rx when resistance measuring circuit 200 is in the closed-circuit configuration. However, in other embodiments, active portion 201 may include components capable of changing the magnitude of current flowing through unknown resistance Rx. In such embodiments, other components can be used to measure the magnitude of the current flowing through unknown resistance Rx to generate a resistance measurement. For example, active portion 201 may include variable resistance components such as thermistors in the current path passing through node n1. In some embodiments described below, it will be assumed that the current flowing through unknown resistances will be measured to obtain resistance measurements. However, it should be understood that in certain embodiments, resistance measurements can be obtained by using a current whose magnitude in the closed-circuit configuration is known a priori.

Current control component 203 operates to control the flow of current through node n1 in the respective closed and open circuit configurations. During the closed-circuit configuration, current control component 203 allows the first current having the relatively large first magnitude to flow through node n1, and during the open-circuit configuration, current control component 203 limits the flow of current through node n1 to the second magnitude, which is smaller than the first magnitude.

Typically, the current control component 203 functions by limiting the flow of current in response to an elevated voltage level of node n1 or measurement terminal 206. For instance, when unknown resistance Rx is disconnected from first and second measurement terminals 206 and 207, the voltage level of node n1 rises. In response to this rise, current control component 203 attenuates the current through node n1 by, e.g., partially closing a switch along the current path through node n1. Later, when another unknown resistance having a relatively small magnitude is connected between first and second measurement terminals 206 and 207, the voltage level of node n1 will fall and, in response, current control component 203 could elevate the magnitude of the current flowing through node n1, e.g., by re-opening the switch.

Voltage measuring component 204 and current measuring component 205 are used to measure the current and voltage at first and second measurement terminals 206 and 207 during the closed-circuit configuration in order to calculate the magnitude of unknown resistance Rx using Ohm's law: Vx/Ix=Rx, where Vx is the voltage across unknown resistance during the closed-circuit configuration and Ix is the current flowing through Rx during the closed-circuit configuration. As explained above, it may not be necessary to actually measure current flowing through unknown resistance Rx if the current can be ascertained a-priori.

The values Vx and Ix can be measured using any of several conventional techniques, including but not limited to, e.g., measuring voltages and currents of components other than unknown resistance Rx and then inferring or approximating Vx and/or Ix from these measurements. In addition, the values of Vx and Ix can be digitally sampled and/or processed to compute the magnitude of unknown resistance Rx. Such sampling and/or processing can be accomplished, e.g., using components such as conventional analog-to-digital (A-D) conversion units or other more specialized sampling and/or processing components. Although not specifically illustrated in FIG. 2, such sampling and/or processing components could be included in active portion 201 or connected to active portion 201 via input/output interfaces.

Figure 3A:
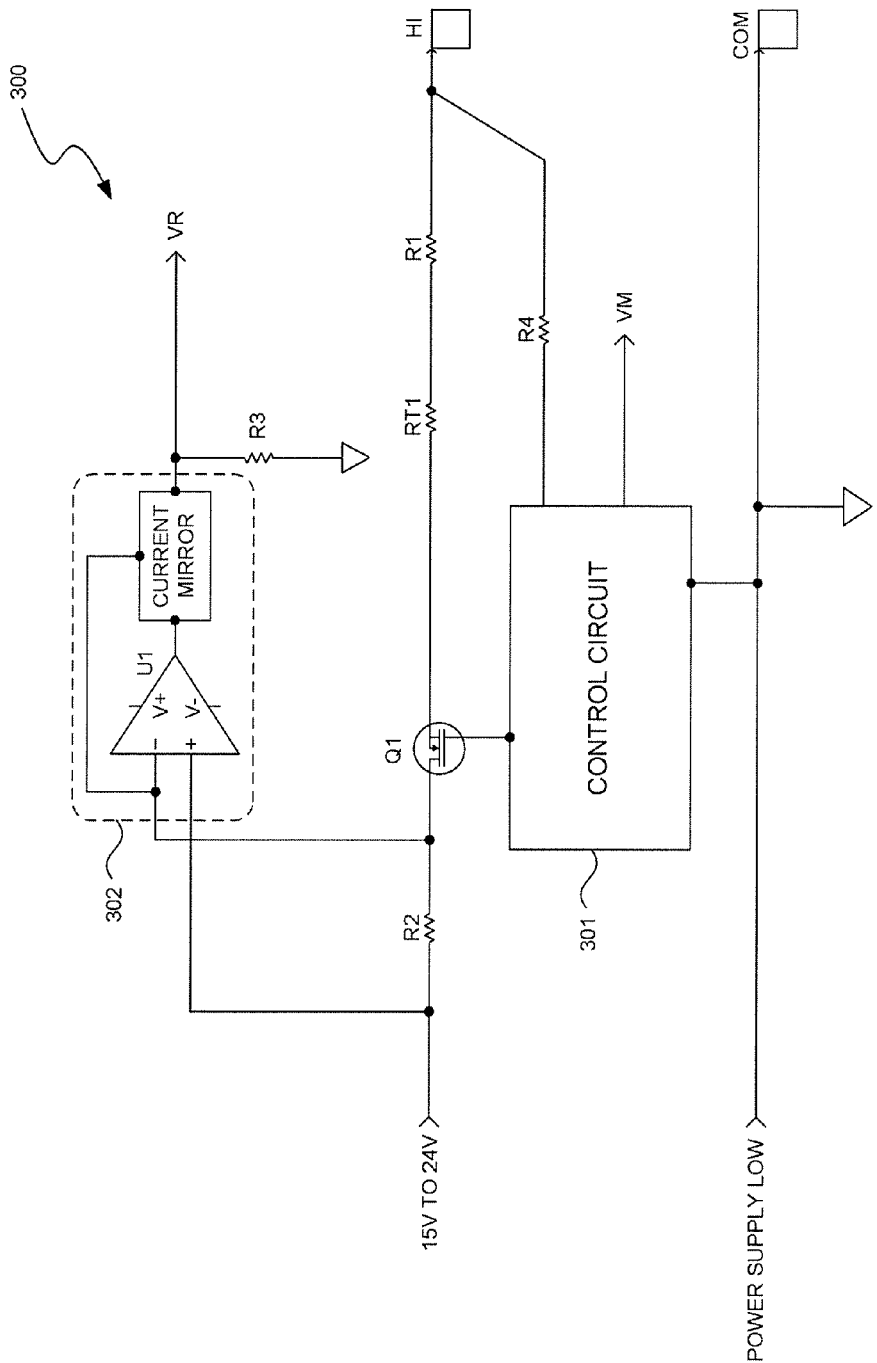
FIGS. 3A and 3B are circuit diagrams illustrating example circuits for measuring electrical resistance.
Figure 3B:
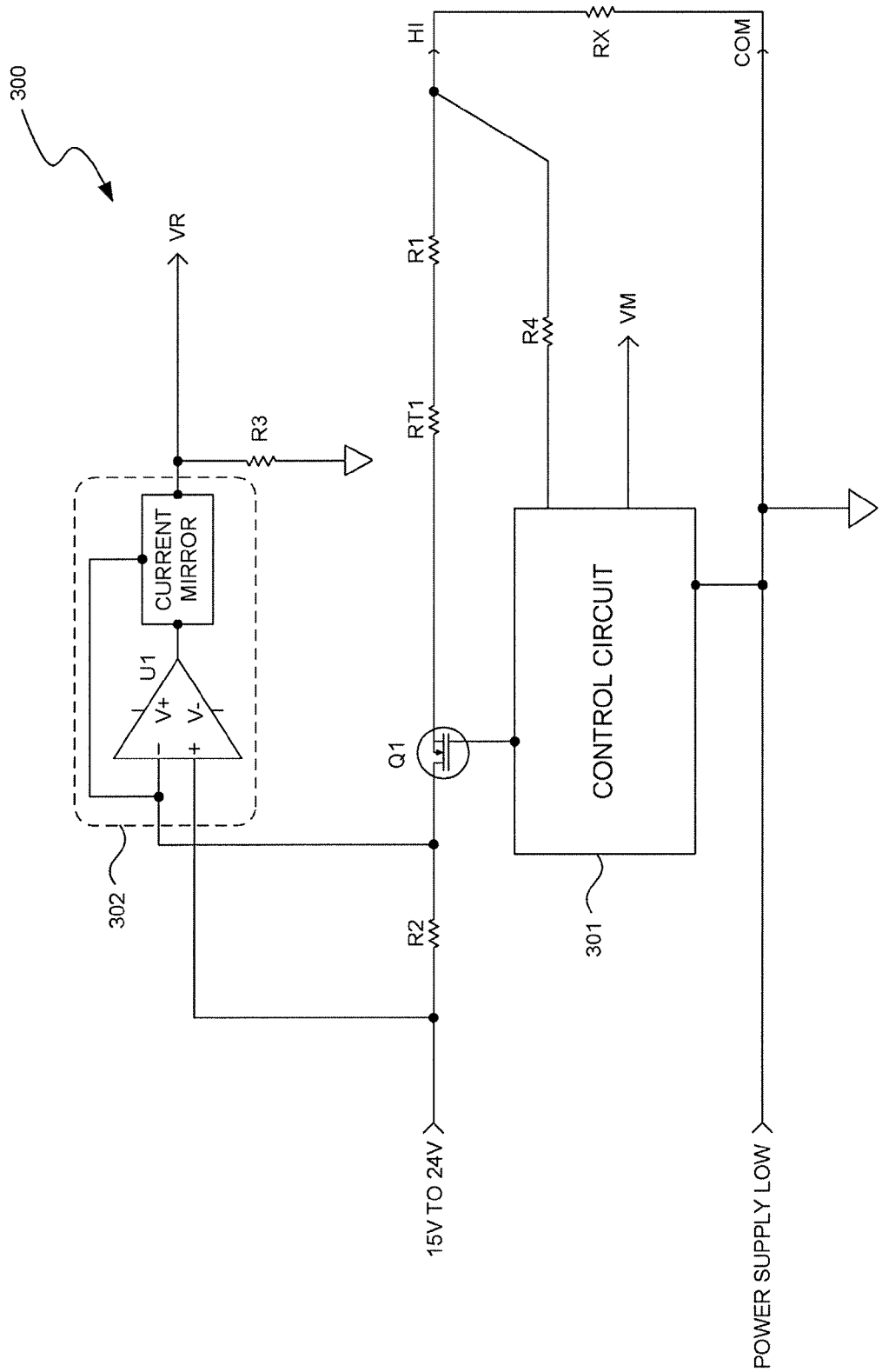

FIGS. 3A and 3B are schematic diagrams illustrating a resistance measurement circuit 300 implementing a low-ohms measurement function. Resistance measurement circuit 300 can be used to implement resistance measurement circuit 200. Like other resistance measurement circuits discussed herein, resistance measurement circuit 300 could be implemented in a variety of devices or systems including multimeters. However, it should be noted that some of the components within resistance measurement circuit 300 are especially beneficial in the context of multimeters and therefore may be omitted in other embodiments. For example, resistance measurement circuit 300 includes a thermistor adapted to protect its internal circuits against high input currents which may occur in cases such as where measurement terminals of a multimeter are accidentally connected across a high voltage when the multimeter is in a low-ohms measurement mode.

FIG. 3A shows resistance measurement circuit 300 in an open-circuit configuration and FIG. 3B shows resistance measurement circuit 300 in a closed-circuit configuration. The composition of resistance measurement circuit 300 will be described below with reference to FIG. 3A and then selected functions of resistance measurement circuit 300 will be described with reference to FIGS. 3A and 3B.

Referring to FIG. 3A, resistance measurement circuit 300 comprises a control circuit 301, a level-shifter 302, first through fourth resistors R1 through R4, a thermistor RT1, a field-effect transistor (FET) Q1, and respective upper and lower measurement terminals HI and COM. Level-shifter 302 comprises an operational amplifier (op-amp) U1 and a current mirror, which collectively amplify and output a voltage difference across second resistor R2 to generate a level-shifted output voltage.

Second resistor R2 has a first terminal connected to a power-supply voltage (e.g., ~15-24 V) and further connected to a non-positive input of op-amp U1. Second resistor R2 has a second terminal connected to an inverting input of op-amp U1 and further connected to a first terminal (e.g., a source or drain) of FET Q1.

Third resistor R3 has a first terminal connected to the output of level shifter 302 and a second terminal connected to a common voltage (e.g., ground or a low power supply voltage). The first terminal of third resistor R3 is connected to an analog-to-digital (A-D) converter as indicated by an arrow labeled "VR". The A-D converter is used to sample and digitize the voltage level of the first terminal of third resistor R3 when the low-ohms measurement function is being performed.

FET Q1 has its first terminal connected to the second terminal of second resistor R2, a second terminal (e.g., a source or drain) connected to a first terminal of thermistor RT1, and a third terminal (e.g., a gate) connected to control circuit 301.

Thermistor RT1 has its first terminal connected to the second terminal of FET Q1 and a second terminal connected to a first terminal of first resistor R1.

First resistor R1 has its first terminal connected to the second terminal of thermistor RT1 and a second terminal connected to upper measurement terminal HI.

Fourth transistor R4 has a first terminal connected to upper measurement terminal HI and a second terminal connected to control circuit 301.

Control circuit 301 is connected to the third terminal of FET Q1, the second terminal of fourth resistor R4, and lower measurement terminal COM, which is connected to the common voltage. Control circuit 301 is also connected to an application specific integrated circuit (ASIC) as indicated by an arrow labeled "VM". The ASIC may function, for example, to receive and manipulate various measurement values performed by resistance measurement circuit 300. In addition, the ASIC may coordinate different functions of a multimeter including resistance measurement circuit 300.

Referring to FIG. 3B, the magnitude of an unknown resistance Rx is measured by connecting the unknown resistance Rx between upper and lower measurement terminals HI and COM, passing a measurement current through unknown resistance Rx, and measuring the magnitude of the measurement current and the voltage drop across unknown resistance Rx under these conditions. Once the magnitude of the test current and the voltage drop across unknown resistance Rx has been measured, the magnitude of unknown resistance Rx can be calculated using Ohm's law, $Vx=Ix*Rx$, where "Ix" is the measured magnitude of the measurement current passing through unknown resistance Rx and Vx is the measured magnitude of the voltage drop across unknown resistance Rx.

When unknown resistance Rx is disconnected from upper and lower measurement terminals HI and COM (i.e., when resistance measurement circuit 300 has the open-circuit configuration), the voltage level of upper measurement terminal HI increases. Conversely, when unknown resistance Rx is connected to upper and lower measurement terminals HI and COM, the voltage level of upper measurement terminal HI decreases.

Accordingly, to prevent unnecessary power consumption in resistance measurement circuit 300 when the low-ohms measurement function is not being performed, control circuit 301 operates in response to changes in the voltage level of upper measurement terminal HI to control the gate bias of FET Q1 and thereby modify the magnitude of current flowing through a current path including thermistor RT1 and first transistor R1. In particular, control circuit 301 operates to control the gate bias voltage of FET Q1 such that a relatively smaller current flows through this current path during the open-circuit configuration, and such that a relatively larger current flows through this current path during the closed-circuit configuration.

For simplicity of explanation, it will be assumed that during the open-circuit configuration of resistance measurement circuit 300, the gate bias voltage of FET Q1 is controlled to place FET Q1 in a state "fully ON" in which FET Q1 has minimal or relatively low drain-source resistance, and during the closed-circuit configuration, the gate bias voltage of FET Q1 is controlled to place FET Q1 in a state "partially ON" in which FET Q1 has sufficient drain-source resistance to significantly attenuate the magnitude of current flow through the current path including thermistor RT1 and first transistor R1. In spite of this assumption, it should be understood that the gate bias voltages applied to FET Q1 during the respective open and closed circuit configurations can be varied over a substantial range across different embodiments of resistance measurement circuit 300.

To further illustrate the operation of resistance measurement circuit 300, an example of resistance measurement circuit 300 is described using specific values of voltages, currents, and resistances. This example is provided for illustrative purposes, and not by way of limitation.

In this example, it will be assumed that the power source voltage has a magnitude of 20V, the common voltage has a magnitude of 0V, first resistor R1 has a resistance of 1 k ohm, second resistor R2 has a resistance of 10 ohms, third resistor R3 has a resistance of about 5 k ohms, fourth resistor R4 has a resistance of about 1 M ohm, thermistor RT1 has a resistance of 1 k ohm, and unknown resistance Rx has a magnitude less than 100 ohms.

Assuming the above values, then where resistance measurement circuit 300 is in the closed-circuit configuration illustrated in FIG. 3B, nearly 10 milli-amperes (mA) of current flows through a current path including first thermistor TR1 and first resistor R1. In contrast, where resistance measurement circuit 300 is in the open-circuit configuration illustrated in FIG. 3A, significantly less than 10 mA of current flows through the current path including first thermistor TR1 and first resistor R1.

Where resistance measurement circuit 300 is in the closed-circuit configuration, level-shifter 302 amplifies a voltage drop across second resistor R2 to generate a level-shifted output voltage on the first terminal of third resistor R3. The level-shifted output voltage of third resistor R3 is then sampled by the A-D converter indicated by the reference label "VR" to generate a measured value of the current passing through second transistor R2. In this example, the measured current passing through second resistor R2 is generated by evaluating the amplified voltage drop across second resistor R2 in view of the resistance of second and third resistors R2 and R3 and electrical characteristics of level-shifter 302. For example, assuming a known value of second resistor R2, and known amplification characteristics of level-shifter 302, the current flowing through second resistor R2 could be computed by applying Ohm's law to the voltage level apparent on the first terminal of third transistor R3 and the resistance value of second resistor R2, and then scaling the result by a gain factor of level-shifter 302.

Because the resistance value of fourth resistor R4 is significantly larger than unknown resistance Rx, relatively less current flows across fourth resistor R4 during the closed-circuit configuration of resistance measurement circuit 300. As a result, the measured current flowing across second resistor R2 can be used as an indication, a surrogate, or an approximation of the current flowing across unknown resistance Rx.

The voltage drop across unknown resistance Rx is calculated by measuring the voltage level of upper measurement terminal HI relative to the level of the common voltage. This measurement can be accomplished by any of a variety of techniques. For example in one embodiment, the measurement is accomplished using a voltage measurement taken across fourth resistor R4.

Once measurements have been acquired for the voltage drop across unknown resistance Rx and the current flowing through unknown resistance Rx, these measurements can be combined, typically using Ohm's law, to generate a value for the magnitude of unknown resistance Rx. The combination of the measurements can be performed, for example, by a digital logic circuit residing in the ASIC or some other companion circuit of resistance measuring circuit 300.

Where resistance measuring circuit 300 is in the closed-circuit configuration illustrated in FIG. 3B, using the example components described above, slightly less than 10 mA of current flows through unknown resistance Rx and a reduced amount of current flows through fourth resistor R4. In this case, if resistance Rx has a magnitude of less than 100 ohms and lower measurement terminal COM is connected to ground (assumed 0V), then upper measurement terminal HI will have a voltage level of less than 1V during the closed circuit configuration.

However, where unknown resistance Rx is subsequently disconnected from resistance measurement circuit 300 and resistance measuring circuit 300 assumes the open-circuit configuration illustrated in FIG. 3A, the voltage level of upper measurement terminal HI will increase. In response to this increase, control circuit 301 controls the voltage level of the gate of FET Q1 such that FET Q1 is partially turned off As a result, the current flowing through the current path including thermistor RT1 and first resistor R1 significantly decreases.

Figure 4:
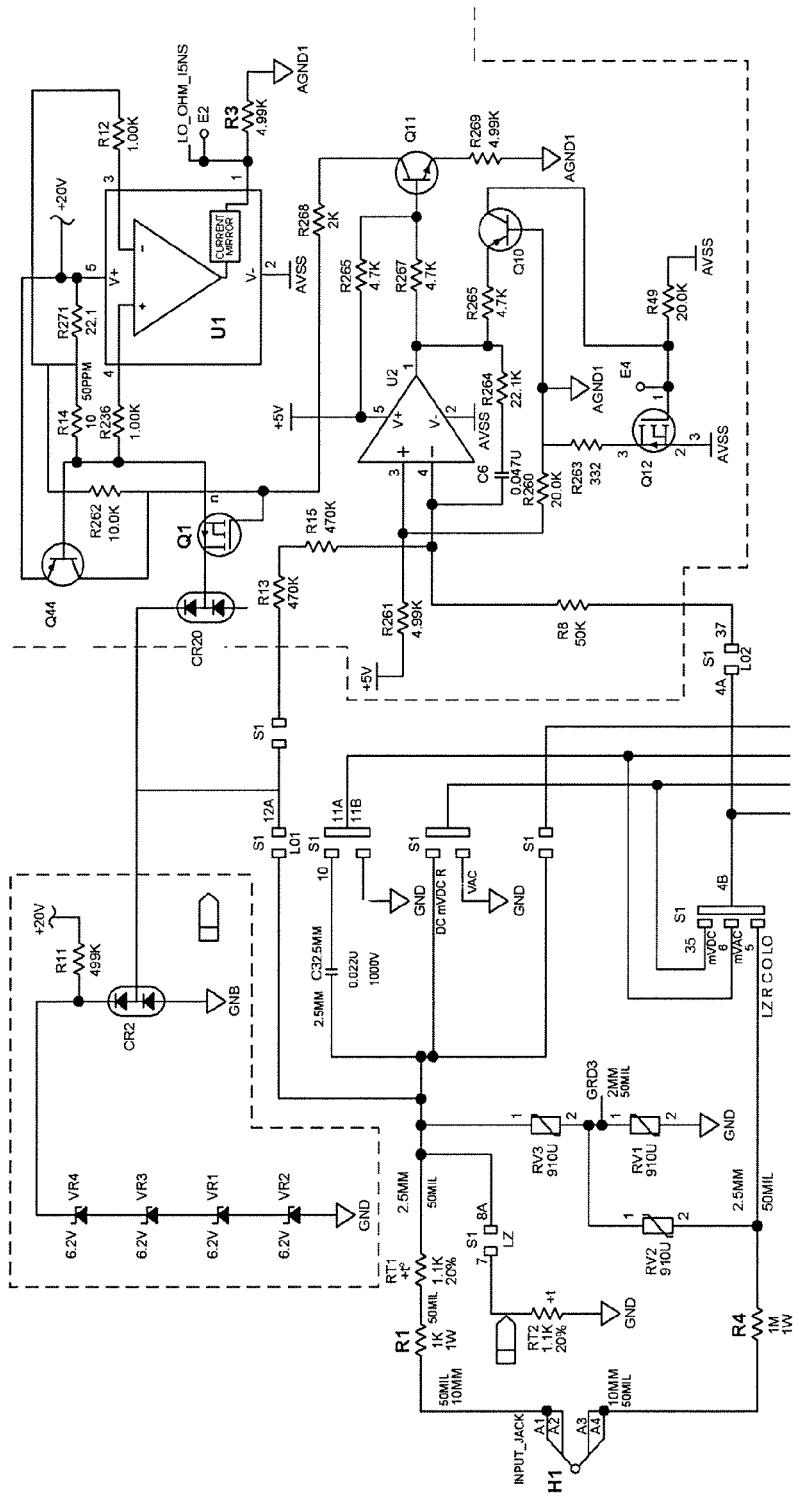
FIG. 4 is a circuit diagram illustrating an example implementation of a control circuit.

An example embodiment implementing control circuit 301 is illustrated in FIG. 4. In the example of FIG. 4, control circuit 301 and resistance measuring circuit 300 both reside within a multimeter. As indicated by different switches shown in FIG. 4, different conduction paths are used for the different functions of the multimeter. For instance, a path at the bottom of FIG. 4, labeled "LZ R CO LO" is used for the low-ohms measurement function. In the example illustrated in FIG. 4, some features of resistance measurement circuit 300 that are also shown in FIGS. 3A and 3B are indicated by large-type reference labels for ready comparison.

In the example of FIG. 4, control circuit 301 is implemented using an op-amp labeled U2 and related components illustrated in FIG. 4. Where the voltage level of upper measurement terminal HI (shown on the left side of FIG. 4) rises during the open-circuit configuration of resistance measurement circuit 300, the voltage levels of respective inputs and outputs of op-amp U2 vary such that the current through fourth resistor R4 is reduced during the open-circuit configuration.

Although not explicitly shown or described, a variety of different embodiments implementing control circuit 301 based on the description herein can be implemented. For example, different systems and method for controlling the gate voltage of FET Q1 in relation to the voltage level of upper measurement terminal HI can be used.

Figure 5:
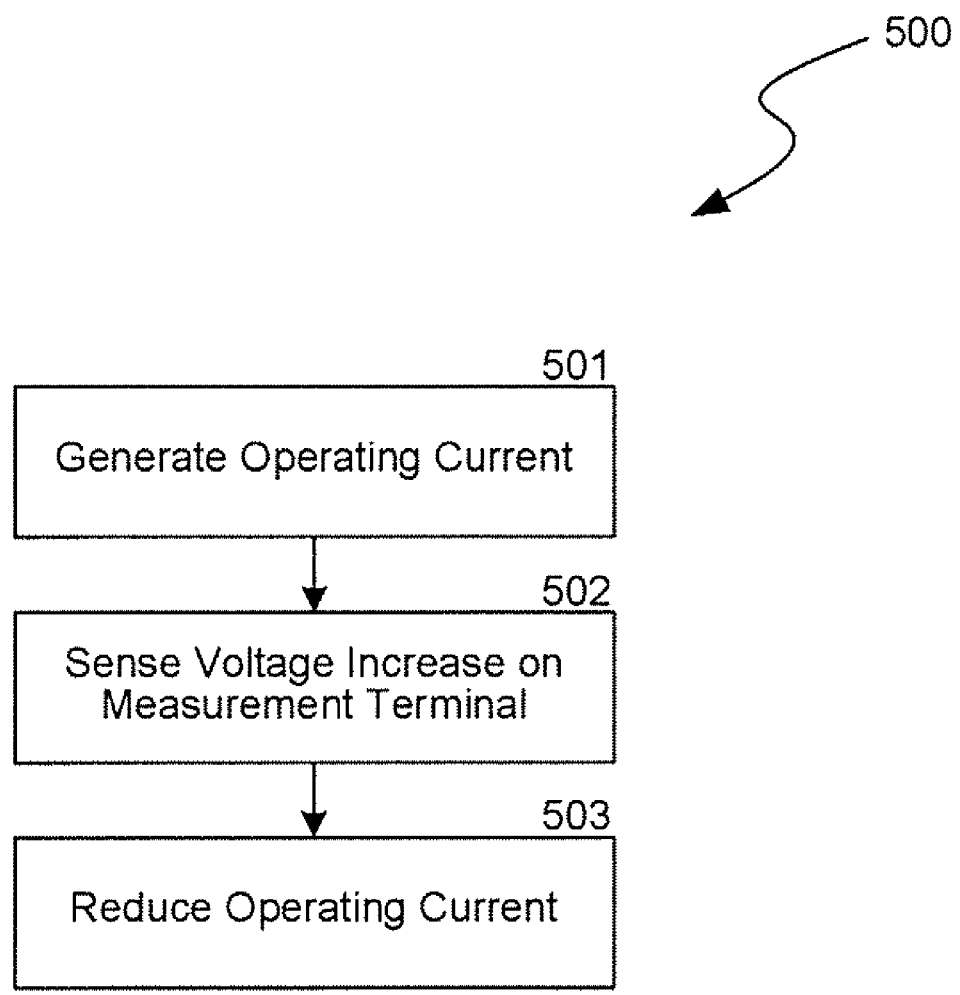
FIG. 5 is a flowchart illustrating an example method for measuring electrical resistance and reducing operating current.

FIG. 5 is a flowchart broadly illustrating a method of operating a circuit or apparatus capable of measuring electrical resistance in accordance with selected embodiments of the invention. In the description that follows, method steps will be denoted by parentheses (xxx). For illustrative convenience, the method will be described in the context of resistance measuring circuit 300 illustrated in FIG. 3. However, it should be understood that the method could be performed in a variety of different apparatuses employing a pair of measurement terminals to measure an unknown electrical resistance.

In the method of FIG. 5, an operating current is generated through an unknown resistance connected between first and second measurement terminals such as upper and lower measurement terminals HI and COM shown in FIG. 3 (501). When unknown resistance Rx is disconnected from the first or second measurement terminal, the voltage level of the first measurement terminal is elevated, e.g., in the manner of upper measurement terminal HI in FIG. 3, and this elevation is sensed by a current control component such as control circuit 301 (502). Upon sensing the elevation of the voltage level of the first measurement terminal, the current control component controls a current generating component to reduce the operating current (503). This reduction may be accomplished, for example, in the same manner that control circuit 301 reduces the current flowing through first resistor R1 by placing FET Q1 in the state "partially ON".

As with other disclosed embodiments, the method illustrated and FIG. 5 can be modified in any of several ways and can be embodied in a variety of diverse contexts without departing from the scope of the invention. In particular, while the description above has been made with reference to a field-effect transistor (FET), many other components having a switch-like functionality could be used to modulate or control the amount of current provided by the power source to the target resistance.

CONCLUSION

Many specific details of certain embodiments of the invention are set forth in the description and in FIGS. 1-5 to provide a thorough understanding of these embodiments. A person skilled in the art, however, will understand that the invention may be practiced without several of these details or additional details can be added to the invention. In particular, while the description above is provided with specific reference to a low-ohms measurement function, the circuits and methods could also be applied to other measurement functions which can result in a current draw in an open-circuit configuration. Selected well-known structures and functions have not been shown or described in detail to avoid unnecessarily obscuring the description of the embodiments of the invention. As used herein, one or more components "coupled" or "connected" to each other can be coupled or connected directly (i.e., no other components are between the coupled components) or indirectly (i.e., one or more other components can be placed between the coupled components). Similarly, components coupled or connected "between", or "across" other features are not necessarily connected directly to each of those other features.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Additionally, the words "herein," "above," "below," and words of similar import, when used in this application, shall generally refer to this application as a whole and not necessarily to any particular portions of this application. Where the context permits, words in the above Detailed Description using the singular or plural number may also include the plural or singular number respectively. The word "for," in reference to a list of two or more items, covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other circuits, methods and systems, and not only those described above. The elements and acts of the various embodiments described above can be combined or altered to provide further embodiments.

These and other changes can be made to the invention in light of the above Detailed Description. While the above description describes certain embodiments of the invention, and describes the best mode contemplated, no matter how detailed the above appears in text, the invention can be practiced in many ways. Details of the system may vary considerably in its implementation details, while still being encompassed by the invention disclosed herein.

The terminology used in the Detailed Description is intended to be interpreted in its broadest reasonable manner, even though it is being used in conjunction with a detailed description of certain specific embodiments of the invention. Certain terms may even be emphasized; however, any terminology intended to be interpreted in any restricted manner will be overtly and specifically defined as such in this Detailed Description section. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

What is claimed:

1. A resistance measuring circuit, comprising:
   a first measurement terminal and a second measurement terminal, wherein a target resistance to be measured is coupled to the first measurement terminal and the second measurement terminal;
   a current generating component configured to generate a current along a current path passing through a node connected to the first measurement terminal, wherein the current generating component generates a first current responsive to the target resistance; and
   a voltage measuring component configured to measure a voltage drop across the first measurement terminal and the second measurement terminal,
   wherein a first voltage drop is measured by the voltage measuring component when the target resistance is present, and when the voltage measuring component measures an increase in the voltage drop from the first voltage drop, an open circuit is established between the first measurement terminal and the second measurement terminal, and the current generating component generates a second current in response, wherein the second current has a lower magnitude than the first current.

2. The resistance measuring circuit of claim 1, further comprising:
   a current measuring component configured to measure the magnitude of the first current.

3. The resistance measuring circuit of claim 2, wherein the current measuring component comprises a level shifter circuit configured to amplify and output a voltage drop across a resistor of known resistance located along the current path.

4. The resistance measuring circuit of claim 2, wherein the current generating component comprises a voltage source.

5. The resistance measuring circuit of claim 1 further comprising:
   a current control component configured to control the current generating component based on a voltage level of the first measurement terminal, wherein the current control component controls the current generating component by actuating a switch connected along the current path in response to a voltage level of the first measurement terminal.

6. The resistance measuring circuit of claim 5, wherein the switch comprises a field effect transistor (FET).

7. The resistance measuring circuit of claim 5, wherein the switch comprises a transistor that is actuated from a fully-on state when the resistance measuring circuit is in a closed-circuit configuration to a partially-on state when the resistance measuring circuit is in an open-circuit configuration.

8. The resistance measuring circuit of claim 1, wherein the magnitude of the first current is between 5 and 10 mA and the magnitude of the second current is less than 3 mA.

9. The resistance measuring circuit of claim 1, further comprising a battery-powered handheld electrical multimeter.

10. The resistance measuring circuit of claim 1, wherein the second current has a non-zero magnitude.

11. A method of controlling output current in an electronic apparatus capable of measuring electrical resistance, comprising:
    generating a first current along a current path to a first measurement terminal, wherein the generating is responsive to a target resistance connected between the first measurement terminal and a second measurement terminal; and
    measuring a voltage drop between the first measurement terminal and the second measurement terminal;
    reducing the first current to a second current upon measuring an increase in the voltage drop between the first measurement terminal and the second measurement terminal.

12. The method of claim 11, further comprising determining a magnitude of the target resistance based upon the first current and a measured voltage difference between the first measurement terminal and the second measurement terminal when the target resistance is connected.

13. The method of claim 11, wherein the second current has a non-zero magnitude.

14. The method of claim 11, wherein reducing the first current to a second current comprises actuating a switch connected along a current path of the generated current in response to the increase in the voltage drop.

15. The method of claim 11, wherein the first current is between 5 mA and 10 mA, and the second current is less than 3 mA.

16. A resistance measuring circuit, comprising:
    a current generating component that generates a first current along a current path to a first measurement terminal, wherein the first current is generated responsive to a target resistance connected between the first measurement terminal and a second measurement terminal;
    a voltage measuring component that measures a voltage drop between the first measurement terminal and the second measurement terminal; and
    means for reducing the current generated by the current generating component from the first current to a second current upon measuring an increase in the voltage drop between the first measurement terminal and the second measurement terminal.

* * * * *